US012671418B2

(12) United States Patent
Chuang et al.

(10) Patent No.: US 12,671,418 B2
(45) Date of Patent: Jun. 30, 2026

(54) SIGNAL GENERATION CIRCUIT AND CONTROL DEVICE

(71) Applicant: Vanguard International Semiconductor Corporation, Hsinchu (TW)

(72) Inventors: Jung-Tsun Chuang, Tainan City (TW); Chieh-Yao Chuang, Kaohsiung City (TW); Wei-Ting Chen, Kaohsiung City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 34 days.

(21) Appl. No.: 18/904,842

(22) Filed: Oct. 2, 2024

(65) Prior Publication Data

US 2026/0095181 A1 Apr. 2, 2026

(51) Int. Cl.
H03K 19/003 (2006.01)
H03K 19/00 (2006.01)

(52) U.S. Cl.
CPC ... H03K 19/00384 (2013.01); H03K 19/0005 (2013.01); H03K 19/00361 (2013.01)

(58) Field of Classification Search
CPC ......... H03K 19/00384; H03K 19/0005; H03K 19/00361
USPC ............ 327/108, 534, 561; 330/255; 326/83
See application file for complete search history.

(56) References Cited

U.S. PATENT DOCUMENTS 7,760,023 B2 * 7/2010 Bockelman .............. H03F 3/72
330/252

FOREIGN PATENT DOCUMENTS

| CN | 1627643 | A | 6/2005 |
|---|---|---|---|
| TW | 200847627 | A | 12/2008 |
| TW | 201018085 | A | 5/2010 |
| TW | 201108614 | A | 3/2011 |
| TW | I350055 | B | 10/2011 |
| TW | I379516 | B1 | 12/2012 |
| TW | 201944734 | A | 11/2019 |

OTHER PUBLICATIONS

Taiwanese Office Action and Search Report for Taiwanese Application No. 113131028, dated Jun. 18, 2025.

* cited by examiner

*Primary Examiner* — Arnold M Kinkead
(74) *Attorney, Agent, or Firm* — Birch, Stewart, Kolasch & Birch, LLP

(57) ABSTRACT

A signal generator circuit is provided. The gate of a first transistor and the drain of a second transistor are coupled to a first output terminal. The sources of the first and second transistors are coupled to a first power terminal. The drains of the first and third transistors, and the gate of the second transistor are coupled to a second output terminal. The gate of the third transistor is coupled to a second power terminal. The source of the third transistor is coupled to a third power terminal. A fourth transistor is coupled to the second power terminal and the first output terminal. When the third transistor is turned off, a first bias circuit turns on the fourth transistor. A second bias circuit provides a first predetermined voltage to the second transistor. A third bias circuit provides a second predetermined voltage to the first transistor.

18 Claims, 5 Drawing Sheets

SIGNAL GENERATION CIRCUIT AND CONTROL DEVICE

BACKGROUND OF THE INVENTION

Field of the Invention

The present invention relates to an electrical device, and, in particular, to a signal generation circuit.

Description of the Related Art

With the advancements constantly being made in science and technology and the application of these advancements, there are more and more types of electronic products with greater functionality on the market each year. Most electronic products have a signal generation circuit to generate an output signal. The output signal is provided to an external circuit. When the level of the output signal is unclear, it will cause a malfunction in the external circuit.

BRIEF SUMMARY OF THE INVENTION

In accordance with an embodiment of the disclosure, a signal generation circuit comprises a first transistor, a second transistor, a third transistor, a fourth transistor, a first bias circuit, a second bias circuit, and a third bias circuit. The first transistor comprises a first gate, a first source and a first drain. The first gate is coupled to a first output terminal. The first source is coupled to a first power terminal. The first drain is coupled to a second output terminal. The second transistor comprises a second gate, a second source and a second drain. The second gate is coupled to the second output terminal. The second source is coupled to the first power terminal. The second drain is coupled to the first output terminal. The third transistor comprises a third gate, a third source and a third drain. The third gate is coupled to a second power terminal. The third source is coupled to a third power terminal. The third drain is coupled to the second output terminal. The fourth transistor comprises a fourth gate, a fourth source and a fourth drain. The fourth source is coupled to the second power terminal. The fourth drain is coupled to the first output terminal. The first bias circuit is coupled to the fourth gate to turn on the fourth transistor in response to the third transistor not being turned on. The second bias circuit is coupled to the second output terminal to provide a first predetermined voltage to the second gate. The third bias circuit is coupled to the first output terminal to provide a second predetermined voltage to the first gate.

In accordance with an embodiment of the disclosure, a control device comprises a signal generation circuit. The signal generation circuit comprises a first transistor, a second transistor, a third transistor, a fourth transistor, a first bias circuit, a second bias circuit, and a third bias circuit. The first transistor comprises a first gate, a first source and a first drain. The first gate is coupled to a first output terminal. The first source is coupled to a first power terminal. The first drain is coupled to a second output terminal. The second transistor comprises a second gate, a second source and a second drain. The second gate is coupled to the second output terminal. The second source is coupled to the first power terminal. The second drain is coupled to the first output terminal. The third transistor comprises a third gate, a third source and a third drain. The third gate is coupled to a second power terminal. The third source is coupled to a third power terminal. The third drain is coupled to the second output terminal. The fourth transistor comprises a fourth gate, a fourth source and a fourth drain. The fourth source is coupled to the second power terminal. The fourth drain is coupled to the first output terminal. The first bias circuit is coupled to the fourth gate to turn on the fourth transistor in response to the third transistor not being turned on. The second bias circuit is coupled to the second output terminal to provide a first predetermined voltage to the second gate. The third bias circuit is coupled to the first output terminal to provide a second predetermined voltage to the first gate. The control device further comprises an inverter, a fifth transistor, a sixth transistor, and a logic circuit. The inverter inverts the voltage of the first output terminal to generate an inverted signal. The fifth transistor is coupled between the first power terminal and a third output terminal or between the second power terminal and the third output terminal. The sixth transistor is coupled between the third output terminal and the third power terminal. The logic circuit provides a control signal to a gate of the fifth transistor and a gate of the sixth transistor. In a power-on period, the voltages of the first and second power terminals are increased. In response to the voltage of the first power terminal reaching a target value, the logic circuit generates the control signal according to the input data. In a power-off period, the voltages of the first and second power terminals are reduced. In response to the voltage of the first power terminal being equal to the voltage of the third power terminal, the logic circuit generates the control signal according to the inverted signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
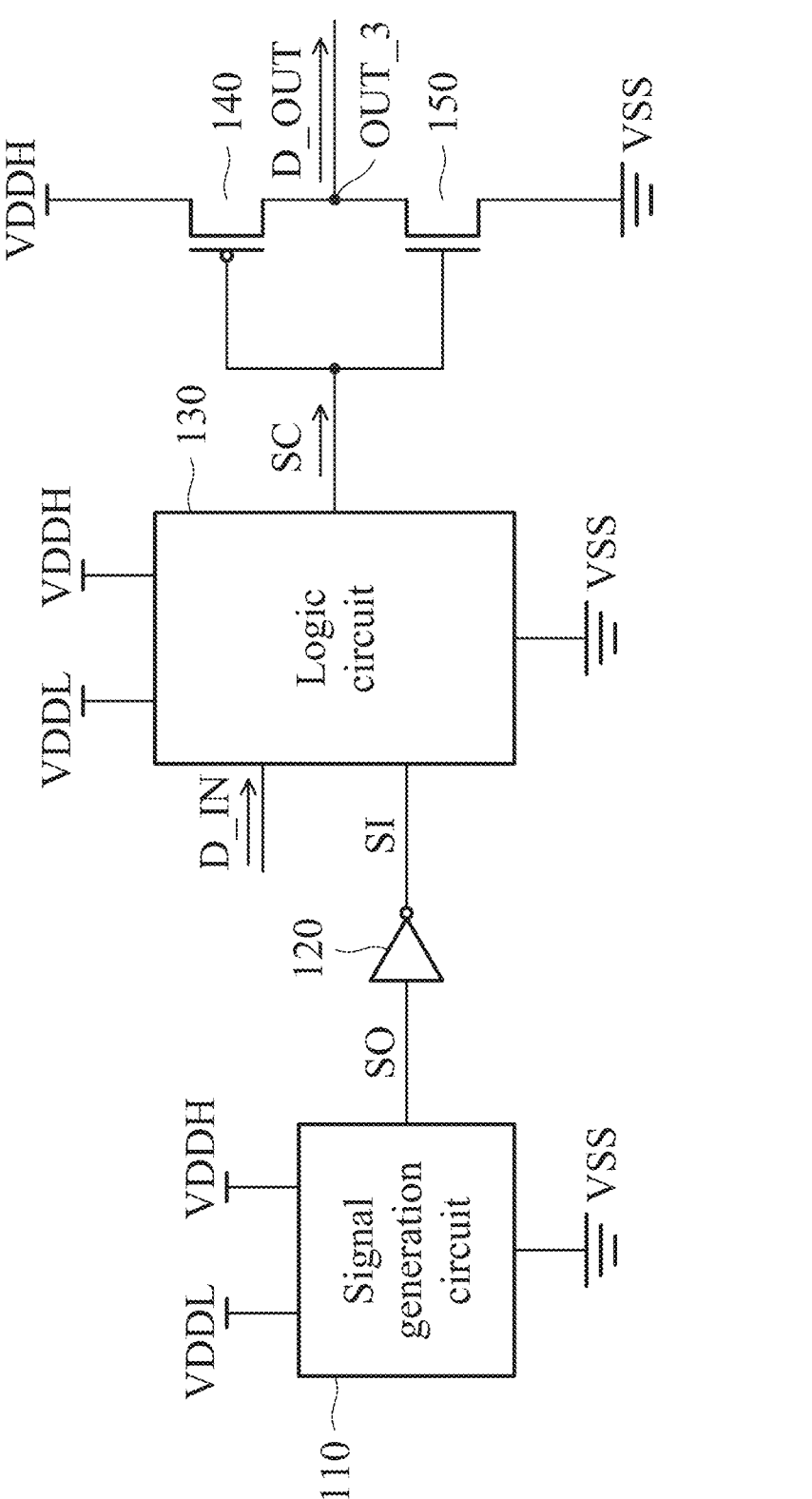
FIG. 1 is a schematic diagram of an exemplary embodiment of a control device according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a control device according to various aspects of the present disclosure. The control device 100 comprises a signal generation circuit 110, an inverter 120, a logic circuit 130, transistors 140, and 150. The signal generation circuit 110 is coupled to power terminals VDDH, VDDL, and VSS and generates an output signal SO according to the voltages of the power terminals VDDH and VDDL. In one embodiment, the voltage of the power terminal VSS is a ground voltage.

In a power-on period, the voltages of the power terminals VDDH and VDDL are gradually increased. When the voltage of the power terminal VDDH reaches a first target value, the voltage of the power terminal VDDH is fixed at the first target value. When the voltage of the power terminal VDDL reaches a second target value, the voltage of the power terminal VDDL is fixed at the second target value. In one embodiment, the first target value is higher than the second target value. For example, the first target value may be 5V and the second target value may be 1.5V.

In this embodiment, when the voltage of the power terminal VDDH reaches the first target value and the voltage of the power terminal VDDL reaches the second target value, this indicates that the voltages of the power terminals VDDH and VDDL are stability. Therefore, the signal generation circuit 110 sets the level of the output signal SO at a first predetermined level, such as a high level. In one embodiment, the level of the output signal SO is equal to the voltage level of the power terminal VDDH.

In a power-off period, the voltages of the power terminals VDDH and VDDL are gradually reduced. When the voltage of the power terminal VDDH is equal to the voltage of the power terminal VSS, the voltage of the power terminal VDDH is fixed and equal to the voltage of the power terminal VSS. When the voltage of the power terminal VDDL is equal to the voltage of the power terminal VSS, the voltage of the power terminal VDDL is fixed and equal to the voltage of the power terminal VSS. In this embodiment, when the voltages of the power terminals VDDH and VDDL are equal to the voltage of the power terminal VSS, the signal generation circuit 110 sets the level of the output signal SO to a second predetermined level, such as a low level. In one embodiment, the level of the output signal SO may be equal to the voltage level of the power terminal VDDL.

The inverter 120 inverts the output signal SO to generate an inverted signal SI. The logic circuit 130 provides a control signal SC according to the inverted signal SI. For example, when the inverted signal SI is equal to a third predetermined level, it indicates that the voltage of the power terminal VDDH reaches the first target value and the voltage of the power terminal VDDL reaches the second target value. Since the voltages of the power terminals VDDH and VDDL are stability, the logic circuit 130 processes input data D_IN according to the voltages of the power terminals VDDH and VDDL to generate the control signal SC. When the inverted signal SI is not equal to the third predetermined level, it indicates that the voltage of the power terminal VDDH does not reach the first target value or the voltage of the power terminal VDDL does not reach the second target value. Therefore, the logic circuit 130 generates the control signal SC according to the inverted signal SI.

The gate of the transistor 140 receives the control signal SC. The drain of the transistor 140 is coupled to an output terminal OUT_3. The source of the transistor 140 is coupled to the power terminal VDDH, but the disclosure is not limited thereto. In other embodiment, the source of the transistor 140 may be coupled to the power terminal VDDL. The gate of the transistor 150 receives the control signal SC. The source of the transistor 150 is coupled to the power terminal VSS. The drain of the transistor 150 is coupled to the output terminal OUT_3. In one embodiment, the transistor 140 is a P-type Metal-Oxide-Semiconductor (PMOS) transistor, and the transistor 150 is a N-type MOS (NMOS) transistor.

When the voltage of the power terminal VDDH is not ready yet (for example, it has not reached the first target value), the logic circuit 130 uses the control signal SC to turn off the transistors 140 and 150. At this time, the output terminal OUT_3 is in a high impedance (Hi-Z) state. However, when the voltage of the power terminal VDDH is ready (for example, it has reached the first target value), the logic circuit 130 turns on the transistor 140 or 150 according to the input data D_IN.

In other embodiments, when the source of the transistor 140 is coupled to the power terminal VDDL and the voltage of the power terminal VDDL is not ready yet (for example, it has not reached the second target value), the logic circuit 130 turns off the transistors 140 and 150. In this case, when the voltage of the power terminal VDDL is ready (for example, it has reached the second target value), the logic circuit 130 turns on the transistor 140 or 150 according to the input data D_IN.

In one embodiment, when the transistor 140 is turned on, the transistor 150 is turned off. Therefore, the voltage of the output terminal OUT_3 is approximately equal to the voltage of the power terminal VDDH. When the transistor 150 is turned on, the transistor 140 is turned off. Therefore, the voltage of the output terminal OUT_3 is approximately equal to the voltage of the power terminal VSS. In some embodiments, the voltage of the output terminal OUT_3 is served as output data D_OUT.

The signal generation circuit 110 detects the voltages of the power terminals VDDH and VDDL. When the voltages of the power terminals VDDH and VDDL are not ready, the logic circuit 130 turns off the transistors 140 and 150 to prevent the erroneous output data D_OUT from affecting the operations of subsequent circuits. When the voltages of the power terminals VDDH and VDDL are stability, the logic circuit 130 sets the level of the output data D_OUT according to the input data D_IN to ensure that subsequent circuits can operate normally.

Figure 2A:
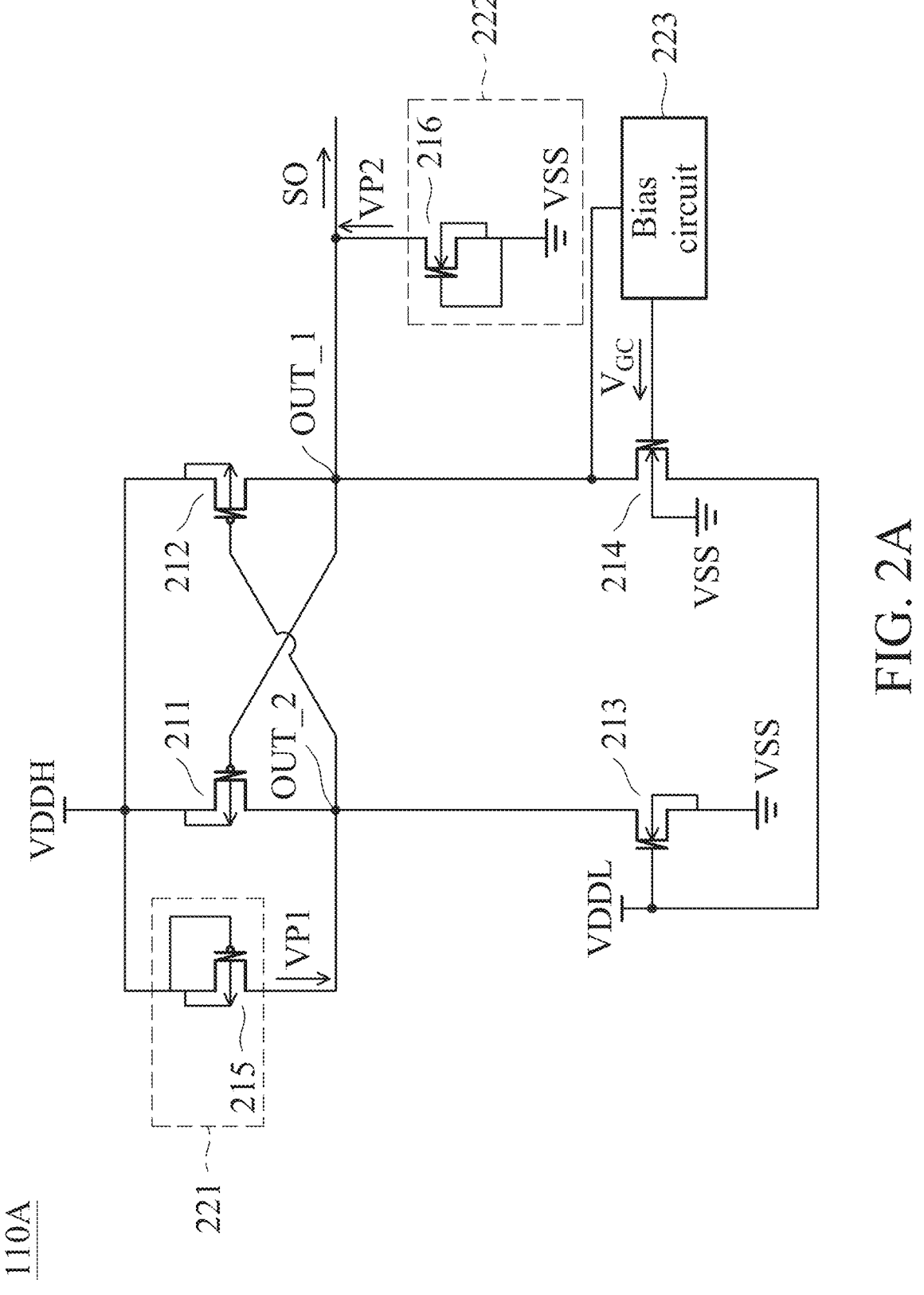
FIG. 2A is a schematic diagram of an exemplary embodiment of a signal generation circuit according to various aspects of the present disclosure.

FIG. 2A is a schematic diagram of an exemplary embodiment of a signal generation circuit according to various aspects of the present disclosure. The signal generation circuit 110 comprises transistors 211~214 and bias circuits 221~223. The gate of the transistor 211 is coupled to an output terminal OUT_1. The source of the transistor 211 is coupled to the power terminal VDDH. The drain of the transistor 211 is coupled to an output terminal OUT_2. The gate of the transistor 212 is coupled to the output terminal OUT_2. The source of the transistor 212 is coupled to the power terminal VDDH. The drain of the transistor 212 is coupled to the output terminal OUT_1. In this embodiment, the transistors 211 and 212 are PMOS transistors. The bulks of the transistors 211 and 212 are coupled to the power terminal VDDH.

The gate of the transistor 213 is coupled to the power terminal VDDL. The source of the transistor 213 is coupled to the power terminal VSS. The drain of the transistor 213 is coupled to the output terminal OUT_2. The gate of the transistor 214 is coupled to the bias circuit 223 to receive the predetermined voltage $V_{GC}$. The source of the transistor 214 is coupled to the power terminal VDDL. The drain of the transistor 214 is coupled to the output terminal OUT_1 and the bias circuit 223. When the transistor 213 is turned off, the bias circuit 223 uses the predetermined voltage $V_{GC}$ to turn on the transistor 214. In this embodiment, the transistors 213 and 214 are NMOS transistors. The bulks of the transistors 213 and 214 are coupled to the power terminal VDDL.

The bias circuit 221 is coupled to the output terminal OUT_2 to provide a predetermined voltage VP1 to the gate of the transistor 212. The structure of bias circuit 221 is not limited in the present disclosure. In this embodiment, the bias circuit 221 comprises a transistor 215. The gate and source of the transistor 215 are coupled to the power terminal VDDH. The drain of the transistor 215 is coupled to the output terminal OUT_2. In one embodiment, the transistor 215 is a PMOS transistor. In this embodiment, the gate and the source of the transistor 215 are coupled together, a small current flows through the transistor 215. The transistor 215 is slightly turned on and generates the predetermined voltage VP1. In some embodiments, the predetermined voltage VP1 can be adjusted by controlling the on-resistance of the transistor 215.

The bias circuit 222 is coupled to the output terminal OUT_1 to provide a predetermined voltage VP2 to the gate of the transistor 211. The structure of bias circuit 222 is not limited in the present disclosure. In this embodiment, the bias circuit 222 comprises a transistor 216. The gate and source of the transistor 216 are coupled to the power terminal VSS. The drain of the transistor 216 is coupled to the output terminal OUT_1. In one embodiment, the transistor 216 is a NMOS transistor. Since the gate and the source of the transistor 216 are coupled together, a small current flows through the transistor 216. The transistor 216 is slightly turned on and generates the predetermined voltage VP2 to the output terminal OUT_1.

The bias circuit 223 is coupled to the gate of the transistor 214 and provides the predetermined voltage $V_{GC}$ to the gate of the transistor 214. In a power-on period, the voltages of the power terminals VDDH and VDDL are gradually increased. When the voltage of the power terminal VDDH reaches a first target value and the voltage of the power terminal VDDL reaches a second target value, the transistor 213 is turned on. Therefore, the voltage of the output terminal OUT_2 is approximately equal to the voltage of the power terminal VSS, such as 0V. At this time, since the gate voltage of the transistor 212 is lower than the source voltage of the transistor 212, the transistor 212 is turned on. Therefore, the output signal SO in the output terminal OUT_1 is approximately equal to the voltage of the power terminal VDDH, such as 5V.

In the power-on period, since the gate voltage of the transistor 211 is approximately equal to the source voltage of the transistor 211, the transistor 211 is turned off. At this time, the bias circuit 222 sets the predetermined voltage $V_{GC}$ so that it is lower than the voltage of the power terminal VDDL. Therefore, the transistor 214 is turned off. Additionally, since the source of the transistor 214 is coupled to the power terminal VDDL, when the voltage of the power terminal VDDL is gradually increased, the difference between the source voltage and the bulk voltage of the transistor 214 is gradually increased. When the voltage of the power terminal VDDL arrives the second target value, the source voltage of the transistor 214 is higher than the bulk voltage of the transistor 214.

In a power-off period, the voltages of the power terminals VDDH and VDDL are gradually reduced. For example, the voltage of the power terminal VDDH is gradually reduced from the first target value to a third target value, and the voltage of the power terminal VDDL is gradually reduced from the second target value to the third target value. In one embodiment, the third target value is equal to the voltage of the power terminal VSS. At this time, since the predetermined voltage $V_{GC}$ is higher than the voltage of the power terminal VDDL, the transistor 214 is turned on. Therefore, the output signal SO of the output terminal OUT_1 is approximately equal to the voltage of the power terminal VDDL, such as 0V. At this time, the transistor 211 is turned on so that the voltage of the output terminal OUT_2 is approximately equal to the voltage of the power terminal VDDH, such as 5V. Since the gate voltage of the transistor 212 is higher than the source voltage of the transistor 212, the transistor 212 is turned off. Additionally, since the gate voltage of the transistor 213 is approximately equal to the source voltage of the transistor 213, the transistor 213 is turned off.

In the power-off period, even if the voltages of the power terminals VDDH and VDDL are gradually reduced, the transistor 214 is turned on since the bias circuit 223 provides the predetermined voltage $V_{GC}$. Therefore, the output signal SO of the output terminal OUT_1 is equal to a second predetermined level, such as a low level. Since the level of the output signal SO of the output terminal OUT_1 is definite, the malfunction of subsequent circuits (such as logic circuit 130 in FIG. 1) can be avoided.

Figure 2B:
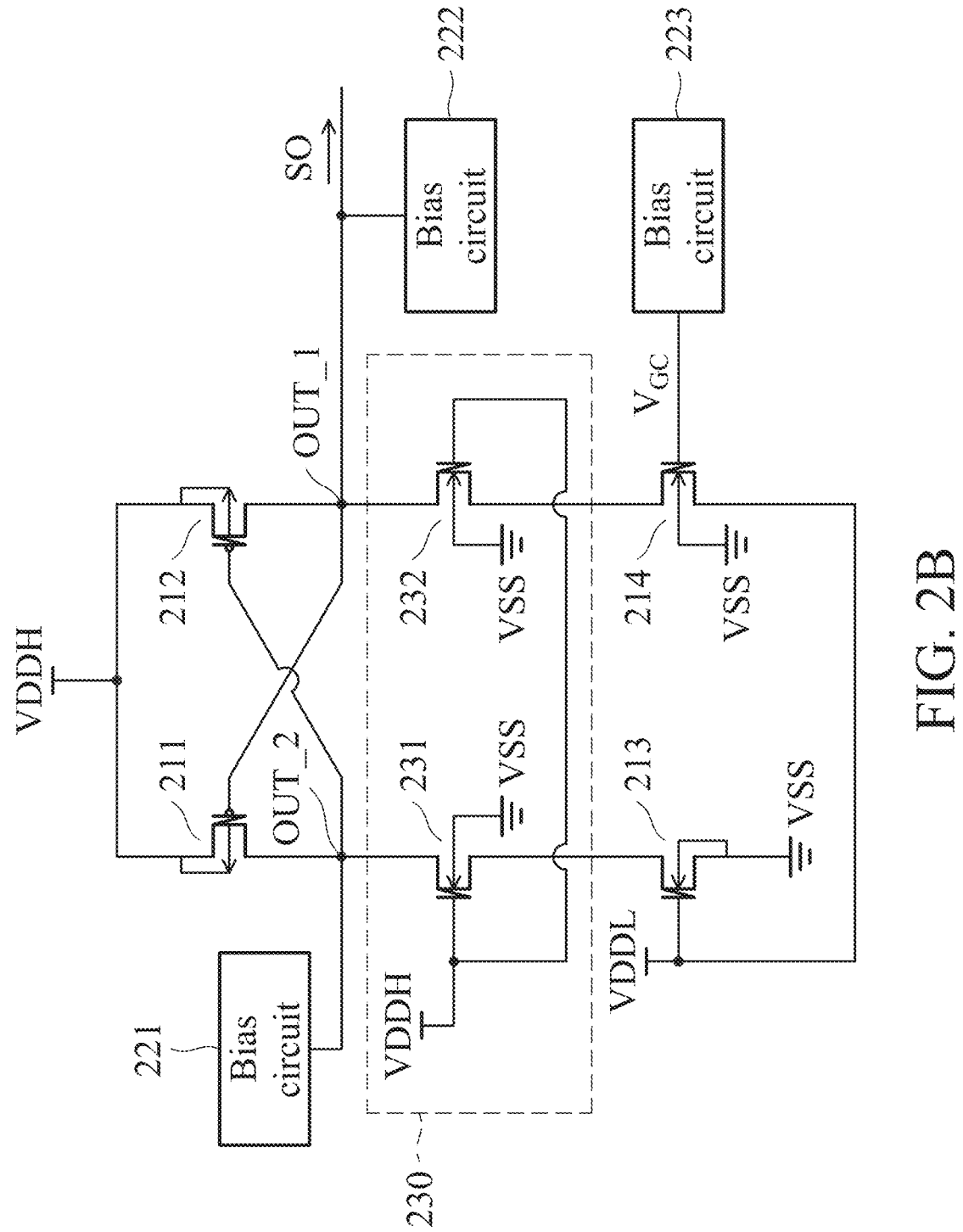
FIG. 2B is a schematic diagram of another exemplary embodiment of the signal generation circuit according to various aspects of the present disclosure.

FIG. 2B is a schematic diagram of another exemplary embodiment of the signal generation circuit according to various aspects of the present disclosure. FIG. 2B is similar to FIG. 2A exception that the signal generation circuit 110B further comprises a reflux blockage circuit 230. When the voltage of the power terminal VDDH is lower than the voltage of the power terminal VDDL, the reflux blockage circuit 230 avoid a reflux current from entering the power terminal VDDH from the power terminal VDDL and through the transistors 214, 232, and 212.

The structure of reflux blockage circuit 230 is not limited in the present disclosure. In this embodiment, the reflux blockage circuit 230 comprises transistors 231 and 232. The gate of the transistor 231 is coupled to the power terminal VDDH. The source of the transistor 231 is coupled to the drain of the transistor 213. The drain of the transistor 231 is coupled to the output terminal OUT_2. The gate of the transistor 232 is coupled to the power terminal VDDH. The source of the transistor 232 is coupled to the drain of the transistor 214. The drain of the transistor 232 is coupled to the output terminal OUT_1. In one embodiment, the transistors 231 and 232 are NMOS transistors. In this case, the bulks of the transistors 231 and 232 are coupled to the power terminal VSS.

For example, when the transistors 213 and 231 are turned on, the voltage of the output terminal OUT_2 approaches the voltage of the power terminal VSS. Therefore, the transistor 212 is turned on so that the voltage of the output terminal OUT_1 approaches the voltage of the power terminal VDDH and the transistor 211 is turned off. At this time, when the voltage of the power terminal VDDH is lower than the voltage of the power terminal VDDL, since one of the transistors 214 and 232 is turned off to avoid a reflux current from entering the power terminal VDDH from the power terminal VDDL and through the transistors 214, 232, and 212.

Figure 3:
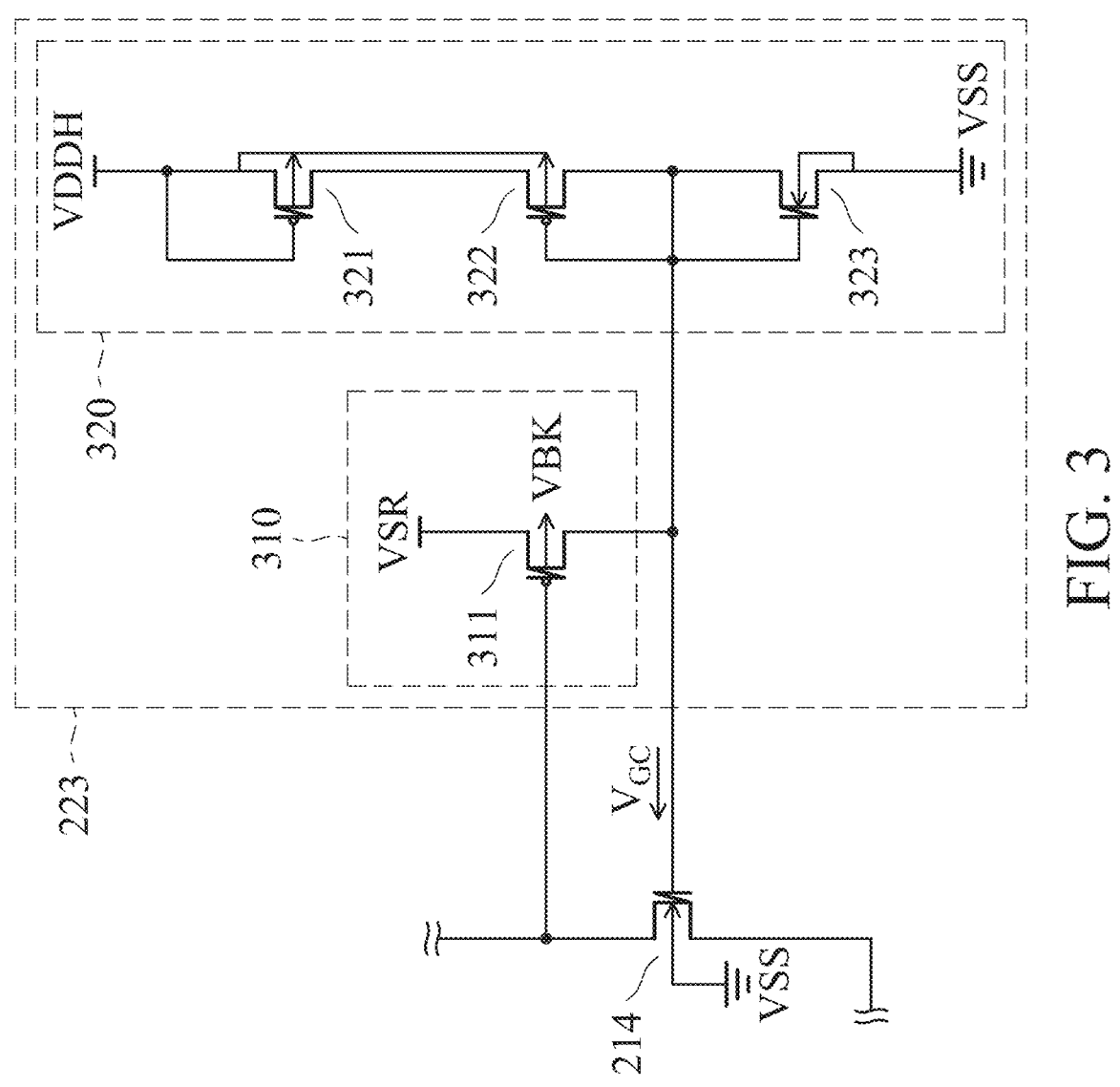
FIG. 3 is a schematic diagram of an exemplary embodiment of a bias circuit according to various aspects of the present disclosure.

FIG. 3 is a schematic diagram of an exemplary embodiment of a bias circuit according to various aspects of the present disclosure. The bias circuit 223 comprises a control circuit 310 and a voltage divider circuit 320. In the power-on period, the voltage divider circuit 320 provides the predetermined voltage $V_{GC}$ to the gate of the transistor 214 to turn off the transistor 214. In the power-off period, the control circuit 310 provides the predetermined voltage $V_{GC}$ to the gate of the transistor 214 to turn on the transistor 214. In this embodiment, the control circuit 310 is coupled to the drain of the transistor 214.

The structure of control circuit 310 is not limited in the present disclosure. In one embodiment, the control circuit 310 comprises a transistor 311. The gate of the transistor 311 is coupled to the drain of the transistor 214. The source of the transistor 311 receives a predetermined voltage VSR. The drain of the transistor 311 is coupled to the gate of the transistor 214 and provides the predetermined voltage $V_{GC}$. In this embodiment, the transistor 311 is a PMOS transistor. In this embodiment, the bulk of the transistor 311 receives a predetermined voltage VBK.

The structure of voltage divider circuit 320 is not limited in the present disclosure. In one embodiment, the voltage divider circuit 320 comprises transistors 321~323. The transistor 321 is connected to the transistor 322 in series between the power terminal VDDH and the gate of the transistor 214. The transistor 323 is coupled between the gate of the transistor 214 and the power terminal VSS. In this embodiment, the transistors 321 and 322 are PMOS transistors, and the transistor 323 is a NMOS transistor. In this case, the bulks of the transistors 321 and 322 are coupled to the power terminal VDDH. The bulk of the transistor 323 is coupled to the power terminal VSS.

The gate and the source of the transistor 321 are coupled to the power terminal VDDH. The drain of the transistor 321 is coupled to the source of the transistor 322. The gate and the drain of the transistor 322 are coupled to the gate of the transistor 214. The gate and the drain of the transistor 323 are coupled to the gate of the transistor 214. The source of the transistor 323 is coupled to the power terminal VSS. In some embodiments, the size of the channel of the transistor 321 is larger than the size of the channel of the transistor 322.

In a power-on period, the voltages of the power terminals VDDH and VDDL are gradually increased. Since the gate and the source of the transistor 321 are coupled together, a small current flows through the transistor 321. The transistor 321 is slightly turned on. In this case, the transistor 321 serves as a current source. The current passing through the transistor 321 enters the transistors 322 and 323. At this time, the predetermined voltage $V_{GC}$ is related to the current passing through the transistor 321 and the on-resistances of the transistors 322 and 323. In one embodiment, the predetermined voltage $V_{GC}$ can be adjusted by adjusting the current passing through the transistor 321.

Figure 4:
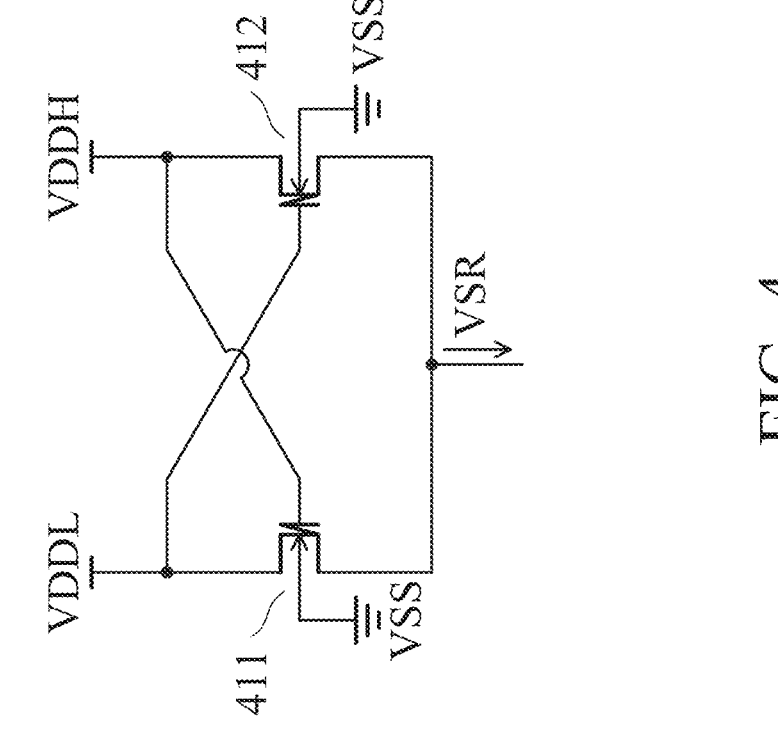
FIG. 4 is a schematic diagram of an exemplary embodiment of a setting circuit according to various aspects of the present disclosure.

FIG. 4 is a schematic diagram of an exemplary embodiment of a setting circuit according to various aspects of the present disclosure. The setting circuit 400 comprises transistors 411 and 412 to generate the predetermined voltage VSR. The setting circuit 400 may be integrated into the bias circuit 223 or independent of the bias circuit 223. In this embodiment, the transistors 411 and 412 are NMOS transistors.

The gate of the transistor 411 is coupled to the power terminal VDDH. The drain of the transistor 411 is coupled to the power terminal VDDL. The source of the transistor 411 is coupled to the source of the transistor 311 to provide the predetermined voltage VSR. The gate of the transistor 412 is coupled to the power terminal VDDL. The drain of the transistor 412 is coupled to the power terminal VDDH. The source of the transistor 412 is coupled to the source of the transistor 311 to provide the predetermined voltage VSR. The bulks of the transistors 411 and 412 are coupled to the power terminal VSS.

In a power-off period, the voltages of the power terminals VDDH and VDDL are gradually reduced. When the voltage of the power terminal VDDH is higher than the voltage of the power terminal VDDL, the transistor 411 is turned on before the transistor 412. Therefore, the predetermined voltage VSR is approximately equal to the voltage of the power terminal VDDL. When the voltage of the power terminal VDDH is lower than the voltage of the power terminal VDDL, the transistor 412 is turned on before the transistor 411. Therefore, the predetermined voltage VSR is approximately equal to the voltage of the power terminal VDDH. Before the voltages of the power terminals VDDH and VDDL approach the voltage of the power terminal VSS, since the predetermined voltage VSR is a minimum voltage, the transistor 311 is turned on to stabilize the gate voltage of the transistor 214 to ensure that the transistor 214 is turned on.

Figure 5:
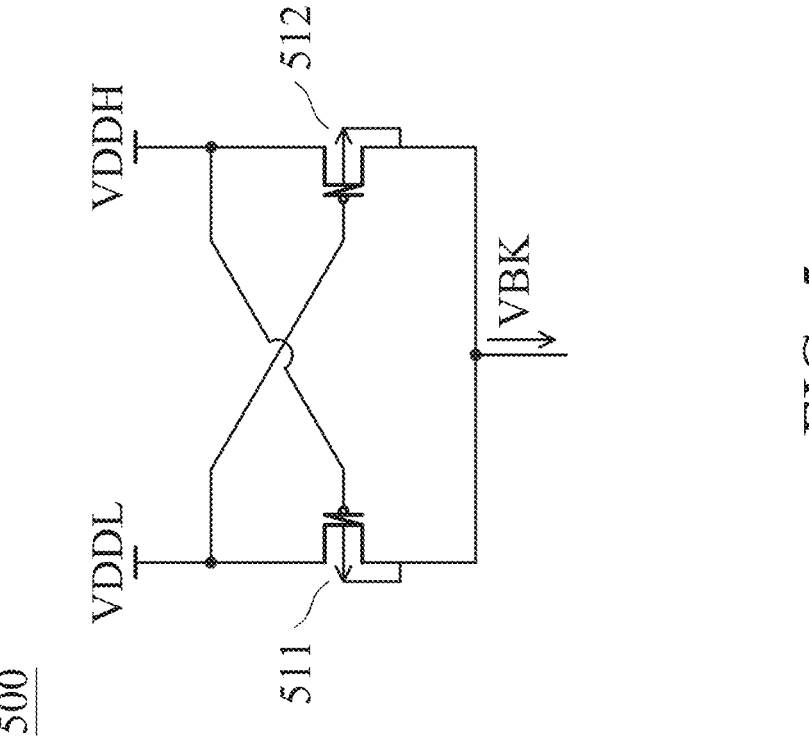
FIG. 5 is a schematic diagram of another exemplary embodiment of the setting circuit according to various aspects of the present disclosure.

FIG. 5 is a schematic diagram of another exemplary embodiment of the setting circuit according to various aspects of the present disclosure. The setting circuit 500 comprises transistors 511 and 512 to generate the predetermined voltage VBK. The setting circuit 500 may be integrated into the bias circuit 223 or independent of the bias circuit 223. In this embodiment, the transistors 511 and 512 are PMOS transistors.

The gate of the transistor 511 is coupled to the power terminal VDDH. The source of the transistor 511 is coupled to the power terminal VDDL. The drain and the bulk of the transistor 511 are coupled to the bulk of the transistor 311 to provide the predetermined voltage VBK. The gate of the transistor 512 is coupled to the power terminal VDDL. The source of the transistor 512 is coupled to the power terminal VDDH. The drain and the bulk of the transistor 512 are coupled to the bulk of the transistor 311 to provide the predetermined voltage VBK.

In a power-off period, the voltages of the power terminals VDDH and VDDL are gradually reduced. When the voltage of the power terminal VDDH is higher than the voltage of the power terminal VDDL, the transistor 512 is first turned on. Therefore, the predetermined voltage VBK is approximately equal to the voltage of the power terminal VDDH. In the power-off period, when the voltage of the power terminal VDDH is lower than the voltage of the power terminal VDDL, the transistor 511 is first turned on. Therefore, the predetermined voltage VBK is approximately equal to the voltage of the power terminal VDDL. Since the predetermined voltage VBK is a maximum value, no leakage current occurs in the transistor 311.

It will be understood that when an element or layer is referred to as being "on", "connected to" or "coupled to" another element or layer, it can be directly on, connected or coupled to the other element or layer or intervening elements or layers may be present. In contrast, when an element or layer is referred to as be "directly on", "directly connected to" or "directly coupled to" another element or layer, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal generation circuit comprising:
a first transistor comprising a first gate, a first source and a first drain, wherein the first gate is coupled to a first output terminal, the first source is coupled to a first power terminal, and the first drain is coupled to a second output terminal;
a second transistor comprising a second gate, a second source and a second drain, wherein the second gate is coupled to the second output terminal, the second source is coupled to the first power terminal, and the second drain is coupled to the first output terminal;
a third transistor comprising a third gate, a third source and a third drain, wherein the third gate is coupled to a second power terminal, the third source is coupled to a third power terminal, and the third drain is coupled to the second output terminal;
a fourth transistor comprising a fourth gate, a fourth source and a fourth drain, wherein the fourth source is coupled to the second power terminal, and the fourth drain is coupled to the first output terminal;
a first bias circuit coupled to the fourth gate to turn on the fourth transistor in response to the third transistor not being turned on;
a second bias circuit coupled to the second output terminal to provide a first predetermined voltage to the second gate; and
a third bias circuit coupled to the first output terminal to provide a second predetermined voltage to the first gate,
wherein:
the first and second transistors are P-type MOS transistors, and the third and fourth transistors are N-type MOS transistors, in a power-on period:
a voltage of the first power terminal and a voltage of the second power terminal are increased,
in response to the voltage of the first power terminal being equal to a first target value and the voltage of the second power terminal being equal to a second target value, the first and fourth transistors are turned off and the second and third transistors are turned on,
the first target value is higher than the second target value, and the second target value is higher than a voltage of the third power terminal.

2. The signal generation circuit as claimed in claim 1, wherein in response to the voltage of the first power terminal being equal to the first target value and the voltage of the second power terminal being equal to the second target value, a voltage of the first output terminal is equal to the first target value.

3. The signal generation circuit as claimed in claim 1, wherein:
in a power-off period:
the voltages of the first and second power terminals are reduced,
in response to the voltages of the first, second and third power terminals all being the same, the first and fourth transistors are turned on, and the second and third transistors are turned off.

4. The signal generation circuit as claimed in claim 3, wherein in the power-on period, a voltage of the fourth source is higher than a voltage of a bulk of the fourth transistor.

5. The signal generation circuit as claimed in claim 3, wherein in response to the voltages of the first, second, and third power terminals all being the same, the voltage of the first output terminal is equal to the voltage of the second output terminal.

6. The signal generation circuit as claimed in claim 5, wherein the first bias circuit comprises:
a voltage divider circuit controlling a voltage of the fourth gate in the power-on period; and
a control circuit controlling the voltage of the fourth gate in the power-off period.

7. The signal generation circuit as claimed in claim 6, wherein the voltage divider circuit comprises:
a first PMOS transistor;
a second PMOS transistor connected to the first PMOS transistor in series between the first power terminal and the fourth gate; and
a first NMOS transistor coupled between the fourth gate and the third power terminal.

8. The signal generation circuit as claimed in claim 7, wherein a size of a channel of the first PMOS transistor is larger than a size of a channel of the second PMOS transistor.

9. The signal generation circuit as claimed in claim 7, wherein:
a gate and a source of the first PMOS transistor are coupled to the first power terminal, a drain of the first PMOS transistor is coupled to a source of the second PMOS transistor, and a gate and a drain of the second PMOS transistor are coupled to the fourth gate, and
a gate and a drain of the first NMOS transistor are coupled to the fourth gate, and a source of the first NMOS transistor is coupled to the third power terminal.

10. The signal generation circuit as claimed in claim 7, wherein the control circuit comprises a third PMOS transistor, a gate of the third PMOS transistor is coupled to the fourth drain, a source of the third PMOS transistor receives a third predetermined voltage, and a drain of the third predetermined voltage is coupled to the fourth gate.

11. The signal generation circuit as claimed in claim 10, wherein:
the first bias circuit further comprises a second NMOS transistor and a third NMOS transistor,
a gate of the second NMOS transistor is coupled to the first power terminal, a drain of the second NMOS transistor is coupled to the second power terminal, and a source of the second NMOS transistor is coupled to a source of the third PMOS transistor, and
a gate of the third NMOS transistor is coupled to the second power terminal, a drain of the third NMOS transistor is coupled to the first power terminal, and a source of the third NMOS transistor is coupled to the source of the third PMOS transistor.

12. The signal generation circuit as claimed in claim 11, wherein:

the first bias circuit further comprises a fourth PMOS transistor and a fifth PMOS transistor, a gate of the fourth PMOS transistor is coupled to the first power terminal, a source of the fourth PMOS transistor is coupled to the second power terminal, and a drain and a bulk of the fourth PMOS transistor are coupled to a bulk of the third PMOS transistor, and a gate of the fifth PMOS transistor is coupled to the second power terminal, a source of the fifth PMOS transistor is coupled to the first power terminal, and a drain and a bulk of the fifth PMOS transistor are coupled to the bulk of the third PMOS transistor.

13. The signal generation circuit as claimed in claim 12, wherein the second bias circuit comprises a sixth PMOS transistor, a gate and a source of the sixth PMOS transistor are coupled to the first power terminal, and a drain of the sixth PMOS transistor is coupled to the second output terminal.

14. The signal generation circuit as claimed in claim 13, wherein the third bias circuit comprises a fourth NMOS transistor, a gate and a source of the fourth NMOS transistor are coupled to the third power terminal, and a drain of the fourth NMOS transistor is coupled to the first output terminal.

15. The signal generation circuit as claimed in claim 1, further comprising:

a reflux blockage circuit, wherein in response to the voltage of the first power terminal being lower than the voltage of the second power terminal, the reflux blockage circuit prevents current from entering the first output terminal from the fourth transistor.

16. The signal generation circuit as claimed in claim 15, wherein:

the reflux blockage circuit comprises a fifth NMOS transistor and a sixth NMOS transistor, a gate of the fifth NMOS transistor is coupled to the first power terminal, a source of the fifth NMOS transistor is coupled to the third drain, and a drain of the fifth NMOS transistor is coupled to the second output terminal, and a gate of the sixth NMOS transistor is coupled to the first power terminal, a source of the sixth NMOS transistor is coupled to the fourth drain, and a drain of the sixth NMOS transistor is coupled to the first output terminal.

17. A control device comprising:

a signal generation circuit comprising:

a first transistor comprising a first gate, a first source and a first drain, wherein the first gate is coupled to a first output terminal, the first source is coupled to a first power terminal, and the first drain is coupled to a second output terminal;

a second transistor comprising a second gate, a second source and a second drain, wherein the second gate is coupled to the second output terminal, the second source is coupled to the first power terminal, and the second drain is coupled to the first output terminal;

a third transistor comprising a third gate, a third source and a third drain, wherein the third gate is coupled to a second power terminal, the third source is coupled to a third power terminal, and the third drain is coupled to the second output terminal;

a fourth transistor comprising a fourth gate, a fourth source and a fourth drain, wherein the fourth source is coupled to the second power terminal, and the fourth drain is coupled to the first output terminal;

a first bias circuit coupled to the fourth gate to turn on the fourth transistor in response to the third transistor not being turned on;

a second bias circuit coupled to the second output terminal to provide a first predetermined voltage to the second gate; and a third bias circuit coupled to the first output terminal to provide a second predetermined voltage to the first gate;

an inverter inverting a voltage of the first output terminal to generate an inverted signal;

a fifth transistor coupled between the first power terminal and a third output terminal or between the second power terminal and the third output terminal;

a sixth transistor coupled between the third output terminal and the third power terminal; and a logic circuit providing a control signal to a gate of the fifth transistor and a gate of the sixth transistor, wherein:

in a power-on period:

a voltage of the first power terminal and a voltage of the second power terminal are increased, in response to the voltage of the first power terminal reaching a target value, the logic circuit generates the control signal according to input data, in a power-off period:

the voltages of the first and second power terminals are reduced, in response to the voltage of the first power terminal being equal to a voltage of the third power terminal, the logic circuit generates the control signal according to the inverted signal.

18. The control device as claimed in claim 17, wherein in the power-off period, the logic circuit turns off the fifth and sixth transistors to set the third output terminal in a high impedance state.

* * * * *